(12) United States Patent  
de Frésart et al.

(10) Patent No.: US 7,592,230 B2
(45) Date of Patent: Sep. 22, 2009

(54) TRENCH POWER DEVICE AND METHOD

(75) Inventors: Edouard D. de Frésart, Tempe, AZ (US); Robert W. Baird, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 349 days.

(21) Appl. No.: 11/510,552

(22) Filed: Aug. 25, 2006

(65) Prior Publication Data

US 2008/0048258 A1 Feb. 28, 2008

(51) Int. Cl.
*H01L 21/336* (2006.01)
(52) U.S. Cl. .................. 438/272; 257/329
(58) Field of Classification Search .......... 257/328, 257/329, 341, 401; 438/389, 738, 272
See application file for complete search history.

(56) References Cited

U.S. PATENT DOCUMENTS

| 5,733,810 | A | 3/1998 | Baba et al. | |
| 6,246,090 | B1 | 6/2001 | Brush et al. | |
| 6,331,466 | B1 * | 12/2001 | Takahashi et al. | 438/268 |
| 6,900,521 | B2 * | 5/2005 | Forbes et al. | 257/616 |
| 2006/0267088 | A1 * | 11/2006 | Sharp et al. | 257/341 |

OTHER PUBLICATIONS

News Release Digest, Hitachi, Ltd., Research and Development Group, Tokyo, Japan, dated Jun. 17, 2005, concerning use of strained silicon in analog semiconductor devices.

* cited by examiner

*Primary Examiner*—Thao X Le
*Assistant Examiner*—Tanika Warrior
(74) *Attorney, Agent, or Firm*—Ingrassia, Fisher & Lorenz, P.C.

(57) ABSTRACT

Means and methods are provided for trench TMOS devices (41-10, 11, 12), comprising, providing a first semiconductor (53, 53') of a first composition having an upper surface (541), with a body portion (54) proximate the upper surface (541), a drift portion (46, 83) spaced apart from the upper surface (541) and a trench (49, 49') having sidewalls (493) extending from the upper surface (541) into the drift portion (46, 83). A second semiconductor (56) adapted to provide a higher mobility layer is applied on the trench sidewalls (493) where parts (78) of the body portion (54) are exposed. A dielectric (70) covers the higher mobility layer (56) and separates it from a control gate (72) in the trench (49, 49'). Source regions (68) formed in the body portion (54) proximate the upper surface (491) communicate with the higher mobility layer (56). When biased, source-drain current (87, 87') flows from the source regions (68) through gate induced channels (78) in the higher mobility layer (56) and into the drift portion (46, 83) where it is extracted by a drain (42) or other connection coupled to the drift portion (46, 83).

16 Claims, 6 Drawing Sheets

TRENCH POWER DEVICE AND METHOD

TECHNICAL FIELD

The present invention generally relates to semiconductor devices, and more particularly relates to semiconductor devices incorporating a trench structure.

Semiconductor devices employing trench structures are well known in the art. FIG. 1 is a simplified schematic cross-sectional view of prior art N-channel TMOS semiconductor device 20 employing a trench structure for the control gate. Device 20 comprises N+ substrate 22, of for example single crystal silicon, which acts as the drain of device 20 and on which is provided drain contact 21 and drain connection 37. N layer 24 is formed on substrate 22, usually by epitaxy. P-body region 26 is provided extending from surface 36 into N layer 24. N+ source regions 28 are provided extending from surface 36 into P-body region 26. Trench 25 is etched into device 20 from surface 36 extending through P-body regions 26 into N layer 24 and generally centered between source regions 28. Portion 23 of N layer 24 beneath trench 25 acts as the drift space of device 20. Gate dielectric 30 is formed on the exposed interior surface of trench 25 and gate 32, of for example polycrystalline silicon, is provided substantially filling trench 25. Contacts 29 are provided on source regions 28 (and P-body regions 26) and coupled to source connection 31. Contact 33 is provided on gate 32 and coupled to gate connection 35. When appropriate bias is applied, source-drain current 39, 39' flows from sources regions 28 through N-channel regions 38 in P-body regions 26 and through N drift space portion 23 of layer 24 to substrate 22 that acts as the drain of device 20. This is conventional.

A problem with such prior art devices is that the performance is less than optimal. One of the causes of this less than optimal performance is that channel regions 38 exhibit lower than desired carrier mobility. This is believed to arise as a consequence of the etching processes (e.g., reactive ion etching (RIE)) commonly used to form trench 25, which may result in some amorphization of the interior surface of trench 25. But the exact cause is not as important as the consequence, since lower mobility in channel region 38 results in higher ON-state resistance (e.g., Rdson) than is desired. Accordingly, there is an ongoing need for improved device structures, materials and methods of fabrication that can overcome this difficulty and provide improved performance. It is also important that such improved performance be obtained without increasing Qgd, the gate-drain charge or capacitance so that the figure of merit (FOM)=Rdson*Qgd, for example, is not adversely affected.

Accordingly, it is desirable to provide improved device structures, especially structures that offer improved Rdson without adversely affecting Qgd, or that allows Qgd to be reduced without increasing Rdson so as to improve the FOM=Rdson*Qgd, while still being able to be fabricated using conventional processing equipment and process chemistry. Further it is desired that the structures and methods be useful with a wide array of device types and not be limited merely to trench-type TMOS devices such as that shown in FIG. 1. It is still further desirable to provide an improved device structure and method of fabrication that is useful with a variety of semiconductor materials. It is further desirable that the methods, materials and structures employed be compatible with present day manufacturing capabilities and materials and not require substantial modifications of available manufacturing procedures or substantial increase in manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

Figure 1:
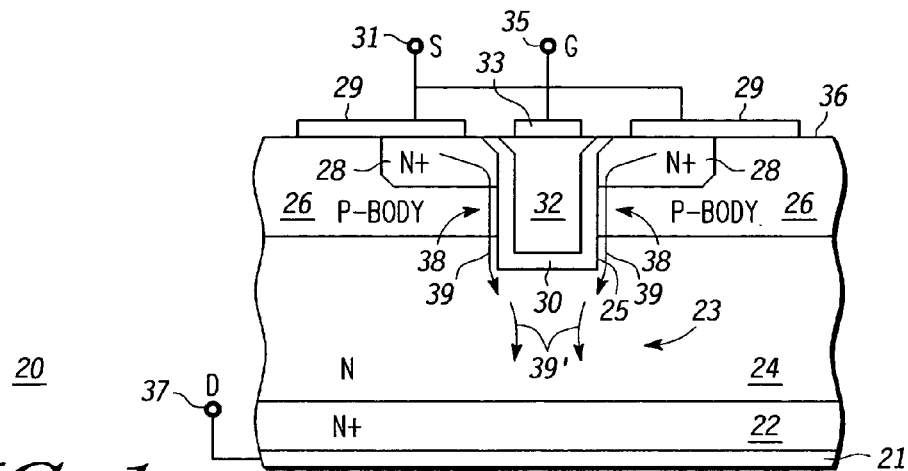
FIG. 1 is a simplified schematic cross-sectional view of a prior art N-channel TMOS semiconductor device employing a trench structure for the control gate.
Figure 2:
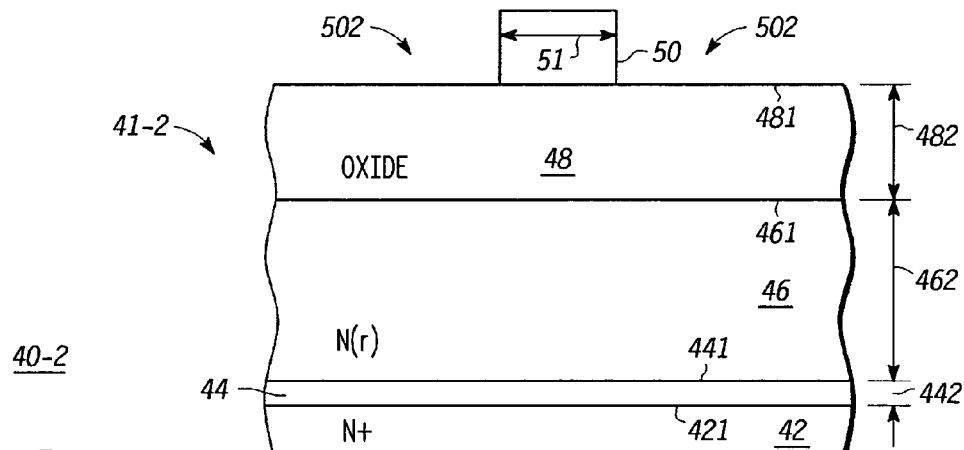
FIG. 2-9 are simplified schematic cross-sectional views of trench-type TMOS semiconductor structures at different stages of manufacture, according to embodiments of the present invention.
Figure 3:
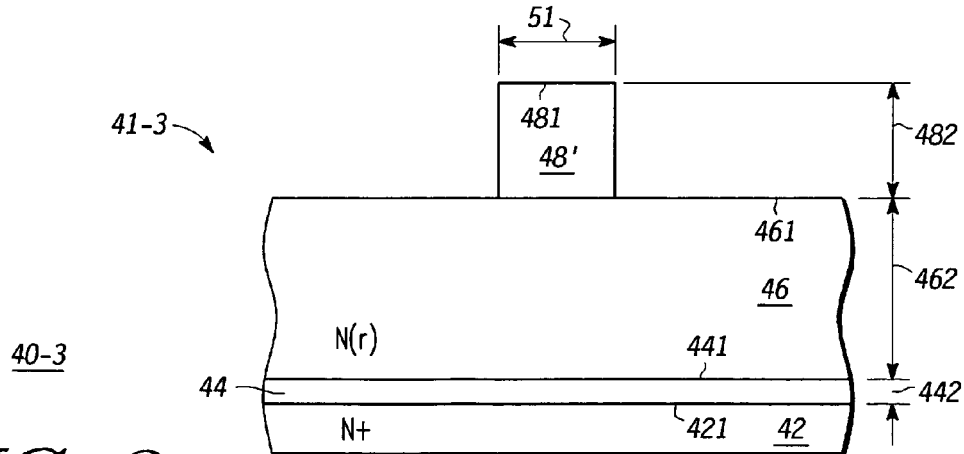

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," right," "in," "out," "front," "back," "up," "down, "top," "bottom," "over," "under," "above," "below" and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner.

For convenience of explanation and not intended to be limiting, the present invention is described for structures formed using Si and Ge as exemplary semiconductor materials, but the present invention is not limited merely to this combination of materials. The principles taught herein apply to a wide variety of semiconductor materials of different lattice constants and/or band gaps that can be combined to produce regions of improved mobility in the active regions of the devices. Non-limiting examples of other suitable semiconductor material combinations are GaN and Si, SiGe and GaAs, GaAs and Ge, Si and $Si_{1-y}C_y$, SiC and AlN, SiC and BP, InGaN and GaN, and various other type IV, III-V and II-VI compounds and mixtures thereof and organic semiconductors. Accordingly, while Si and SiGe are identified as a suitable pair of semiconductor materials to obtain the improved properties described herein, the present invention is not limited thereto.

FIGS. 2-9 are simplified schematic cross-sectional views of trench-type TMOS semiconductor structures 41-2 to 41-9 at different stages 40-2 to 40-9 of manufacture, according to embodiments of the present invention. For convenience of explanation, FIGS. 2-9 and 10-11 illustrate N-channel devices but this is merely by way of example and not intended to be limiting. Persons of skill in the art will understand that by interchanging the various dopant types, P-channel devices can also be made according to further embodiments of the present invention. Other types of devices, such as for example and not intended to be limiting, IGBT devices can also be fabricated using the principals taught herein. Referring now to manufacturing stage 40-2 of FIG. 2, structure 41-2 comprises (e.g., N+ silicon) substrate 42 with upper surface 421 on which is formed (e.g., N-type) transition layer 44 with upper surface 441 and thickness 442, on which is formed (e.g., N-type) semiconductor layer 46 with upper surface 461 and thickness 462, on which is formed epi-growth mask layer 48 with upper surface 481 and thickness 482. As will be subsequently explained, layer 46 is preferably a relaxed (i.e. not significantly stressed) semiconductor layer, but this is not essential. For an N-channel device, substrate 42 is conveniently N+ silicon, arsenic doped to about 2E20 per $cm^3$ and with [100] oriented surface 421, but this is not essential. The thickness of substrate 42 is not critical. About 250 micrometers is convenient for the thickness of substrate 42, but larger and smaller values can also be used. For convenience of explanation, substrate 42 is labeled and/or referred to as N+ silicon in FIGS. 2-9 and 10-11 and associated discussion, but this is merely by way of example and not intended to be limiting. Persons of skill in the art will understand that other materials, doping types, resistivities and orientations can also be used depending upon the particular type(s) of device desired to be formed.

Transition layer 44 is conveniently, for example, either N or P type according to the conductivity of substrate 42 and preferably of graded SiGe with thickness 442 of about 1 to 5 micrometers. For convenience of explanation, it is assumed in connection with FIGS. 3-11 that layer 44 and substrate 42 are both N-type as would be used in forming an N-channel TMOS device, but this is not essential. Chemical vapor deposition (CVD), low pressure chemical vapor deposition (LPCVD), and molecular beam epitaxy (MBE) are well known methods useful for forming layers 44 and 46. LPCVD is preferred. Layer 46 is preferably in-situ doped, for example, N-type for an N-channel device. Its doping level and thickness 462 is adjusted to obtain the desired breakdown voltage. Persons of skill in the art will understand how to make such choices depending upon their particular device application. The purpose of buffer or transition layer 44 is to provide a transition zone from semiconductor (SC) substrate 42 of a suitable substrate material, e.g., silicon, having a first lattice constant, to further semiconductor (SC) materials (e.g., layer 46) having different lattice constants that are applied in subsequent steps so as to make it possible to provide the desired regions of improved mobility. In the case of Si and SiGe mixtures, when substrate 42 is silicon, layer 44 is desirably graded from substantially pure Si (e.g., 100% Si) at surface 421 to a X % Si to Y % Ge mixture at surface 441, where the ratio X:Y at surface 441 is usefully in the range of about 60:40 to 95:05, more conveniently about 70:30 to 90:10 and preferably about 80:20. For an N-channel device, layer 44 is usefully phosphorous doped to about 2E16 per $cm^3$ more or less, and with thickness usefully in the range of about 1.5 to 4.5 micro-meters, more conveniently about 2.5 to 3.5 micrometers, and preferably about 3 micrometers, but thicker or thinner layers and other composition ranges can also be used. Semiconductor layer 46 conveniently has a (e.g., SiGe) composition substantially the same as that of surface 441 of layer 44 so that its lattice constant and band gap substantially matches that of surface 441, so that layer 46 is in a relaxed state. As used herein, the term "relaxed" is intended to indicate that the crystal lattice has the normal spacing for such material in a homogeneous crystal lattice and is not deformed. Similarly, the term "strained" is used herein to indicate that the crystal lattice has been deformed (e.g., stretched or compressed) from its normal spacing for such material so that its lattice spacing is different than what would normally be encountered for such material in a homogeneous relaxed crystal. Epi-growth mask 48 with upper surface 481 and thickness 482 is conveniently formed on upper surface 461 of layer 46. Silicon dioxide is a non-limiting example of a suitable material for epi growth mask layer 48, but other generally refractory inert materials can also be used. Non-limiting examples, of other useful materials for mask layer 48 are low temperature silicon oxide (LTO), oxide formed by plasma enhanced reaction of tetra-ethyl-ortho-silicate (PETEOS), silicon nitride, combinations thereof, etc. Accordingly, use of the word "oxide" in connection with layer 48 is merely for convenience of identification and not intended to be limiting and should be understood to include such other alternatives. Chemical vapor deposition (CVD) or low pressure chemical vapor deposition (LPCVD) or plasma enhanced chemical vapor deposition (PECVD) are examples of suitable techniques for forming epi-growth mask layer 48, but other formation techniques are not precluded. Etch mask 50, of for example photo-resist, with lateral width 51 and openings 502 is provided on outer surface 481 of epi-growth mask layer 48. Structure 41-2 results. In manufacturing stage 40-3 of FIG. 3, epi-growth mask layer 48 is etched in openings 502, leaving behind pillar 48' of epi-growth mask layer 48. It is desirable to use an anisotropic etch that preferentially etches substantially perpendicular to surface 481 rather than isotropically so as to leave pillar 48' of substantially uniform width 51 and height 482 on surface 461 of layer 46. It is desirable to etch out epi-growth mask pillar 48' selectively so as to leave underlying semiconductor surface 461 substantially unaffected. Structure 41-3 results.

Figure 4:
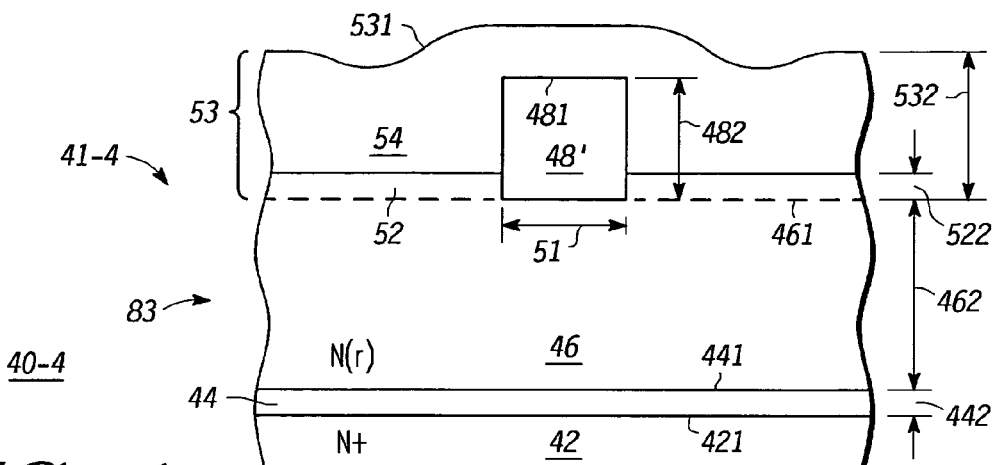

Referring now to manufacturing stage 40-4 of FIG. 4, semiconductor region 53 is deposited on surface 461 of layer 46, to thickness 532 preferably but not essentially exceeding thickness or height 482. Region 53 is desirably arranged to be relaxed by having substantially the same composition and/or lattice constant as surface 461 of layer 46. Region 53 may be N or P type depending upon the particular device structure that is desired. Such doping does not significantly affect the lattice constant and band gap. For an N-channel device, region 53 desirably comprises initial (e.g., phosphorous doped) N-region 52 of about 0.05-0.15 micrometers thickness 522, preferably about 0.1 micrometers thickness and doping densities usefully of about 5E15 to 1E17 per $cm^3$, depending on the desired breakdown voltage, followed by (e.g., boron doped) P-type body region 54 of sufficient thickness so that thickness 532 equals or exceeds thickness 482. Region 54 has doping densities usefully of about 1E17 to 1E18 per $cm^3$ and preferably about 2E17 to 5E17 per $cm^3$, but lower and higher doping densities can also be used depending upon the particular device characteristics that are desired. Region 53 may be in-situ doped during formation or doped after formation using conventional doping techniques. Either arrangement is useful depending upon the type of device being formed and whether graded or uniform doping is desired. Persons of skill in the art will understand how to choose appropriate doping densities and profiles for region 53 depending upon the particular type of device they intend to fabricate. It is desirable that body region 54 (and region 52) is of the same material as layer 46 to ensure that there is no crystal dislocation between drift space 83 (see FIG. 9) of layer 46 and the body region that would create electrical leakage. Region 52 is of the same doping type as layer 46 and is effectively a continuation of drift space 83 provided by layer 46. Selective epitaxial deposition is a preferred means of forming region 53. Selective epitaxial deposition is conveniently performed by low pressure chemical vapor deposition (LPCVD), reduced pressure chemical vapor deposition (RPCVD) or atmospheric pressure chemical vapor deposition (APCVD) using di-chlorosilane or tri-chlorosilane. Ultra-high vacuum chemical vapor deposition UHY-CVD can also be used. Selectivity is improved by use of $GeH_4$ gas mixtures. Some epitaxial lateral overgrowth (ELO) can occur when thickness 532 of portion 53 exceeds pillar height 482. Structure 41-4 results.

Figure 5:
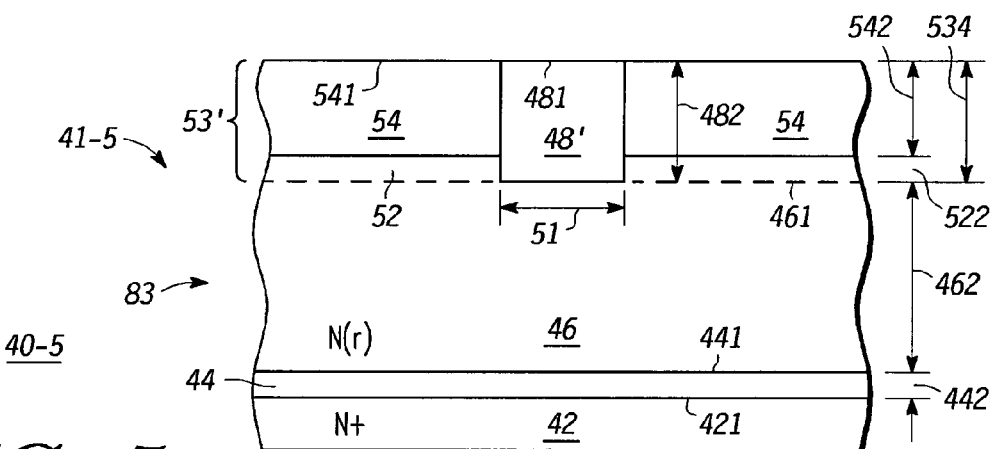

Depending upon the planarity obtained for upper surface 531 of material 53, material 53 may be used as-is following deposition or it may be grown to a thickness larger or smaller than thickness 482 and the combination lapped back to thickness 534, as shown in manufacturing stage 40-5 of FIG. 5, so that region 54 has upper surface 541 substantially coplanar with surface 481 of epi-mask pillar 48'. If region 53 is not initially as thick as pillar height 482, pillar 48' may be lapped so that surfaces 541 and 481 (after lap) are substantially coplanar. Either arrangement is useful. Persons of skill in the art will be able to determine without undue experimentation whether such a lap-back step is needed. Chemical-mechanical polishing (CMP) is an example of a well known suitable planarization technique. Other techniques can also be used. Structure 41-5 results.

Figure 6:
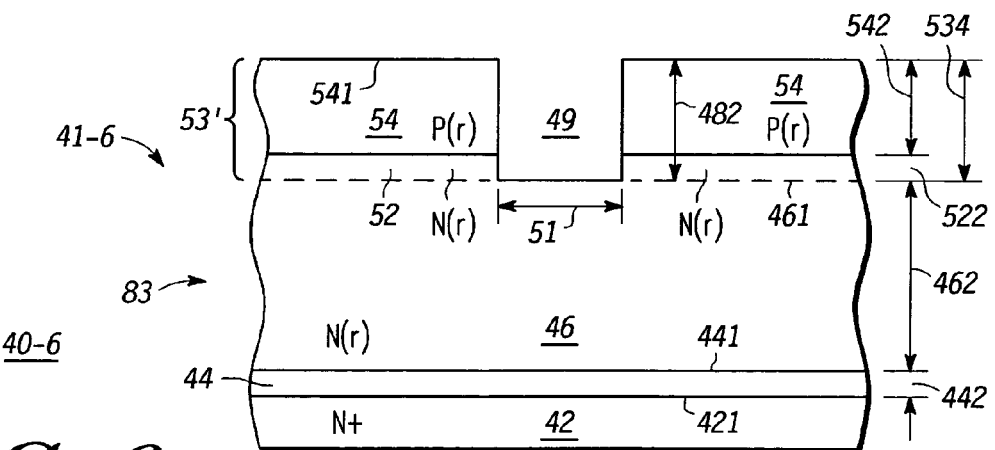

In manufacturing stage 40-6 of FIG. 6, structure 41-5 is selectively etched to remove pillar 48', thereby creating trench 49 and structure 41-6. Since pillar 48' is of, for example, silicon oxide, it may be readily selectively etched without affecting surrounding semiconductor regions 46, 53'. Thus, amorphization of the interior walls of trench 49 is avoided. In manufacturing stage 40-7 of FIG. 7, the semiconductor material of regions 46, 53' surrounding trench 49 is desirably but not essentially slightly etched to round the corners of trench 49 so as to avoid high electric field concentrations at any sharp corners that may be left from the removal of pillar 48' and that might degrade the sustaining voltage of the finished device. As a consequence, modified trench 49' has width 51' slightly greater than width 51 of pillar 48' and depth 492 somewhat greater than height 482 of pillar 48'. Persons of skill in the art will understand how to perform such etching in order to produce the amount of corner rounding that they desire for their particular device application. Wet etching is a suitable technique for such corner rounding wherein the etchant depends upon the particular semiconductor materials being used. For the exemplary SiGe materials described herein, a combination of buffered hydrofluoric acid, hydrogen peroxide and acetic acid, is a suitable etchant mixture. As a consequence of the corner rounding etch, bottom portion 491 of trench 49' generally extends slightly below interface 461 between regions or layers 46 and 52. Structure 41-7 results.

Figure 8:
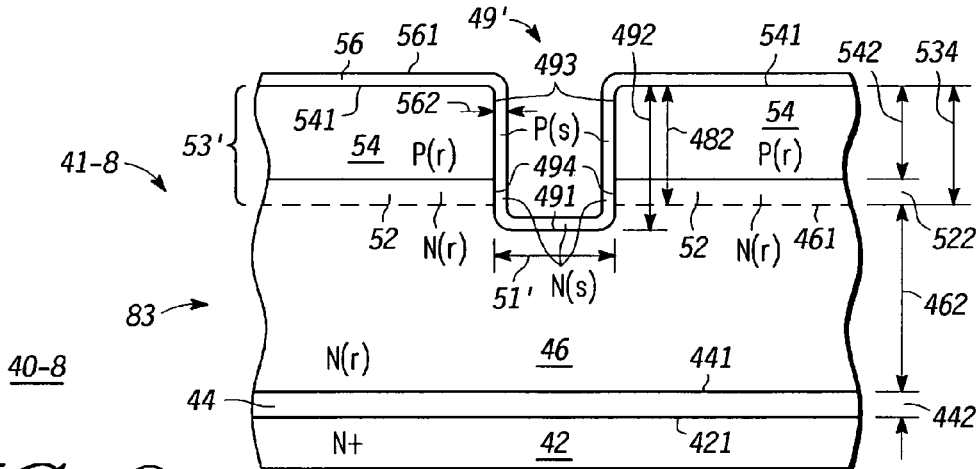

In manufacturing stage 40-8 of FIG. 8, higher mobility semiconductor material 56 is epitaxially deposited in trench 49' to thickness 562, at least on sides 493. As noted earlier, strained silicon is suitable for material 56 in connection with SiGe mixtures for body region 54. Material 56 may also be deposited on bottom surface 491 of trench 49' and on outer surface 541 of layer or region 54 of structure 41-7 but this is not essential. It is arranged that material 56 be strained by using a material of different composition and therefore different lattice constant than the material of regions 46, 53'. If provided, the portions of material 56 on surface 541 are generally later removed, but this is not essential. Thickness 562 is usefully in the range of about 30 to 100 nanometers with about 50 nanometers being preferred. Material 56 may be intrinsic, in which case it will tend to take up the doping type of the material on which it is deposited, or it may be doped during or after formation. Doping of semiconductor material 56 in trench 49' is especially convenient for controlling the threshold voltage and determining whether the resulting device is an enhancement or depletion mode device. Vapor phase epitaxy or molecular beam epitaxy are examples of suitable deposition techniques for semiconductor material 56. LPCVD is preferred. Silicon (doped or undoped) is a non-limiting example of a suitable semiconductor (SC) for material 56 that will be strained relative to the relaxed SiGe semiconductor material of semiconductor regions 46, 53'. Material 56 may be N or P type depending upon the type of finished device that is desired. When intrinsic or relatively lightly doped, material 56 will take up the doping type of the material on which it is formed, for example, becoming P(s)-type where it is deposited on sidewalls 493 of trench 49' on P(r)-type body region 54, and becoming N(s)-type where it is deposited on sidewalls 494 of trench 49' on N(r)-type layer 52 and on bottom 491 of trench 49' on N(r)-type layer 46, where the notation "(r)" indicates desirably relaxed or first mobility material and "(s)" indicates desirably strained or second higher mobility material with respect to semiconductors 46, 53'. Structure 41-8 results. While material 56 is described as a strained material, this is merely a way of obtaining higher mobility material than that of body region 54 where body region 54 is of a relaxed material. Material 56 may be any material that provides a higher mobility than what would ordinarily be encountered in a channel induced in body region 54. Thus, use of a strained semiconductor for material 56 is convenient but not essential provided that material 56 has a higher mobility than the material of body region 54 for the type of carriers than will flow in channels 78 (e.g., see FIGS. 9-11).

Figure 9:
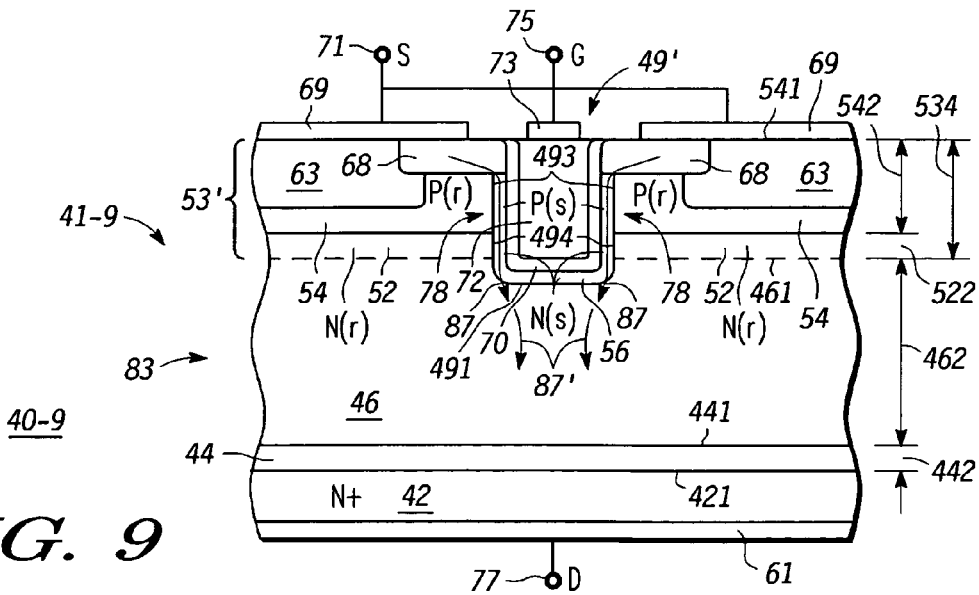

Manufacturing stage 40-9 of FIG. 9 illustrates how structure 41-8 of FIG. 8 may be used to form N-channel trench-type TMOS device 41-9 having improved properties compared to device 20 of FIG. 1. For the case of device 41-9, regions 46 and 52 are N-type and identified as "N(r)", meaning preferably formed of a relaxed N-type semiconductor. Similarly, region 54 is P-type and identified as "P(r)", meaning preferably formed of a relaxed P-type semiconductor. As has been previously noted, SiGe is an appropriate material for regions 46, 52, 54. Material 56 lining trench 49' is identified as "P(s)" or "N(s)" meaning that higher mobility material 56 in trench 49' is conveniently formed of a material (e.g., Si) that becomes strained when epitaxially deposited on the relaxed material (e.g., SiGe) of regions 46, 53'. It is the lattice mismatch between regions 46, 53' and material 56 that creates the strain in material 56 during epitaxial growth in trench 49'. P(r) regions 54 act as P-body regions analogous to P-body regions 26 of FIG. 1 extending from surface 541 to N(r) regions 52. P+ body contacts 63 are conveniently formed extending from surface 541 into P(r) region 54 to reduce contact resistance to P-body regions 54 and N+ source regions 68 analogous to regions 28 of FIG. 1. Gate dielectric 70 analogous to gate dielectric 30 of FIG. 1 is conveniently formed on P(s) material 56 on sides 493 adjacent P-body region 54 and N(s) material 56 on sides 494 adjacent N-type regions 52 and on bottom 491 of trench 49' on N-type material 46. Channel regions 78 analogous to channel regions 38 of FIG. 1 form in higher mobility material 56 on sides 493 between source regions 68 and N-type regions 52. Gate 72 is formed on gate dielectric 70 over channel regions 78 in trench 49', analogous to gate 32 of FIG. 1. Ion implantation is a non-limiting example of a suitable technique for forming body contact and source regions 63, 68 with a dose of about 1E15 to 4E15 per square centimeter being suitable for body contact regions 63, and about 2E15 to 5E15 per centimeter square being suitable for source regions 68, but lower and higher doping may also be used. Thermally grown or deposited silicon oxide of about 200 to 600 Angstrom Units thickness is conveniently used for gate dielectric 70. Doped polycrystalline silicon is suitable for gate 72, but other conductors can also be used. Gate contact 73, of for example AlSiCu analogous to gate contract 33, is provided on gate 72. Source-body contact 69 of for example AlSiCu analogous to contact 29 of FIG. 1 is provided in electrical communication with source region 68 and body contact region 63. Similarly, drain contact 61 is provided on substrate 42. Source, drain and gate connections 71, 75, and 77 are provided in electrical communication with source, gate and drain contacts 69, 73, 61 respectively.

What is different between devices 41-9, 41-10, 41-11 and device 20 is the presence of higher mobility (e.g., strained) semiconductor material 56 for channels 78 relative to (e.g., relaxed) semiconductor materials 46, 53' on which higher mobility material 56 is formed. When device 41-9 is appropriately biased, source-drain current 87, 87' flows from source electrode 71 through source contacts 69 to sources 68, from sources 68 through channels 78 in higher mobility (e.g., strained) N(s) material 56 and through carrier drift space 83 provided by e.g., N(r) layers 52, 46 and through transition layer 44 to substrate 42 which acts as the drain of improved trench TMOS device 41-9. Rdson comprises the combined resistances of the various device regions through which currents 87, 87' of FIGS. 9-11 flow, analogous to currents 39, 39' of FIG. 1. Because the carrier mobility of channel regions 78 in material 56 is higher than the carrier mobility in channel regions 39, Rdson is reduced. For the same device geometry, e.g., gate area, gate dielectric thickness, etc., Qgd is substantially the same. Hence the figure of merit (FOM) =Rdson*Qgd is improved. The FOM can be further improved by including thicker dielectric region 74 (see FIG. 11) over bottom 491 of trench 49', thereby further decoupling gate 72 from drift region 46 and substrate drain 42. This provides additional improvement in the FOM by further reducing Qgd. Region 74 may also be made of a material with a lower permittivity (relative dielectric constant) than gate dielectric 70, further reducing Qgd. Anything that reduces the capacitance per unit area helps. Other things being equal, the lower the figure of merit, the faster the device can operate. Region 74 of thicker and/or lower permittivity dielectric on bottom 491 of trench 49' is not limited to structure 41-11 of FIG. 11 but also may be applied to structures 41-9 and 41-10 of FIGS. 9-10.

Figure 10:
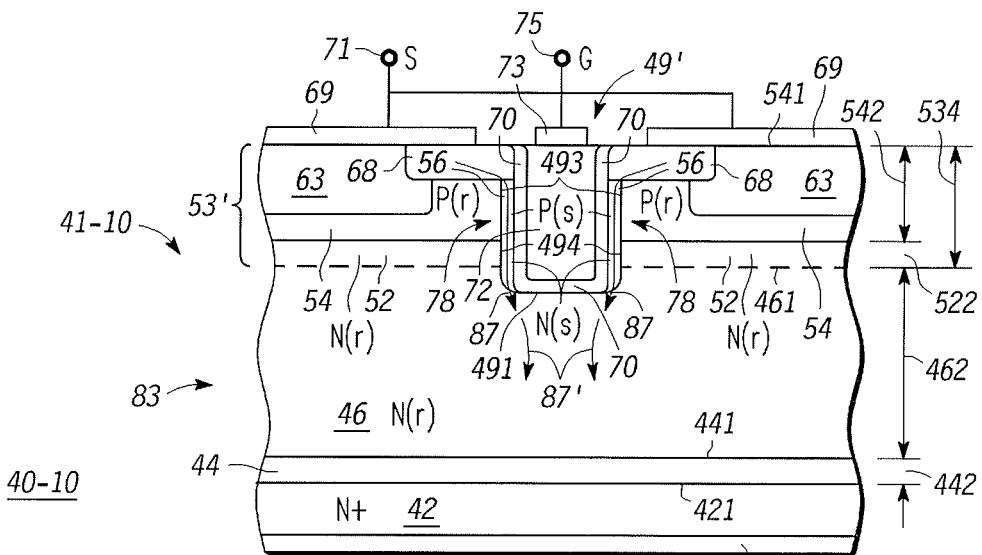
FIGS. 10-11 are simplified schematic cross-section views of trench-type TMOS semiconductor device structures somewhat similar to that in FIG. 9, but according to further embodiments of the present invention.
Figure 11:
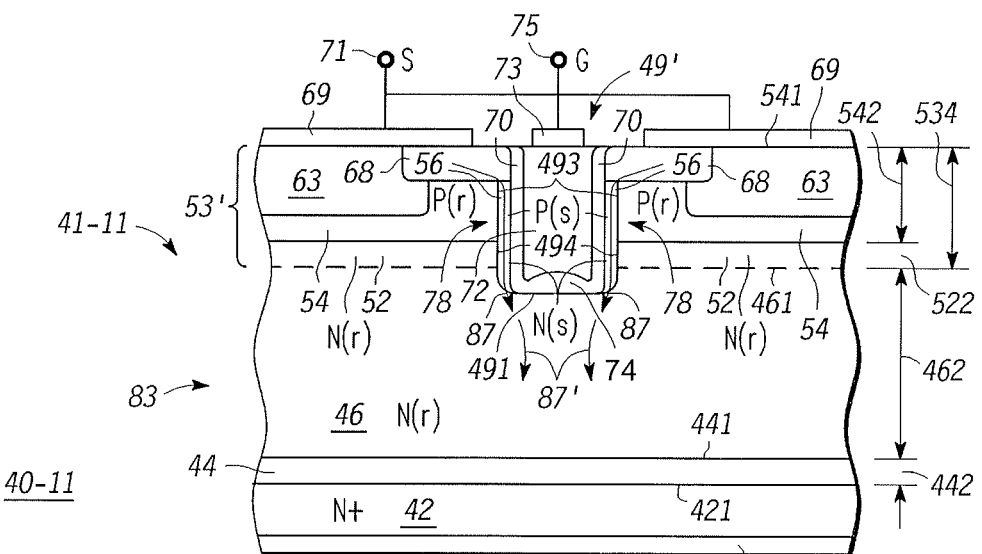

FIGS. 10-11 are simplified schematic cross-section views of trench-type TMOS semiconductor devices 41-10 and 41-11 somewhat similar to device 41-9 of FIG. 9, but according to further embodiments of the present invention. Devices 41-10 and 41-11 differ from device 41-9 of FIG. 9 in that higher mobility semiconductor material 56 does not extend across bottom 491 of trench 49', but has been removed, e.g., by anisotropic etching (e.g., RIE), prior to forming gate oxide 70.

Both devices 41-10 of FIG. 10 and 41-11 of FIG. 11 omit material 56 from surface 491 of trench 49'. Device 41-10 and 4l-11 differ in that in device 41-10 of FIG. 10, gate dielectric 70 has substantially uniform thickness both on sides 493 and bottom 491 of trench 49' while in device 41-11 of FIG. 11, dielectric 74 on bottom 491 of trench 49' separating gate 72 from drift space 83 in semiconductor region 46 is desirably thicker than dielectric 70 over sides 493 of trench 49' separating gate 72 from higher mobility SC material 56 where channel 78 forms. Further, dielectric region 74 can be made of a different material than dielectric 70, for example, a material with a significantly lower dielectric permittivity κ. Increasing the thickness of dielectric region 74 compared to dielectric 70 and reducing its κ value, reduces Qgd without adversely affecting Rdson, so that the FOM=Rdson*Qgd is significantly improved. Other things being equal, this permits higher frequency operation and faster switching speeds. Such improvements are very desirable, especially with power devices such those used, for example, in fast switching DC to DC converters.

Figure 7:
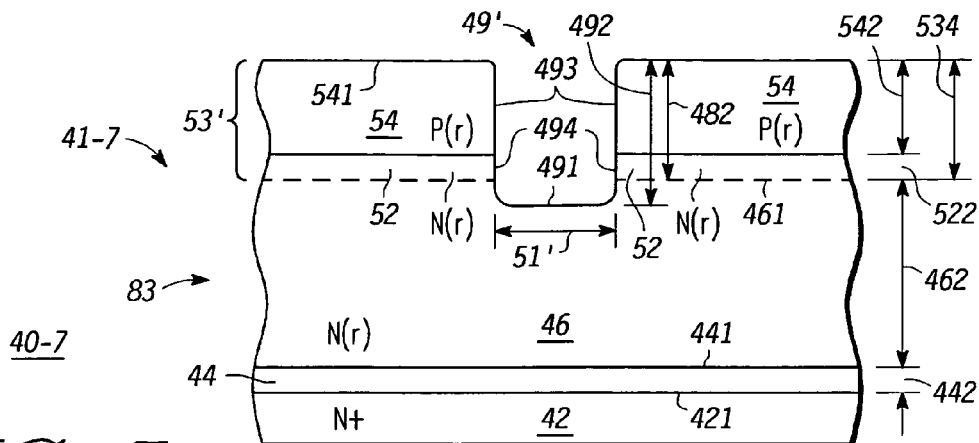

Structure 41-7 shown in FIG. 7 is preferably obtained through the manufacturing sequence illustrated in manufacturing stages 40-2 through 40-7. This has the advantage that an anisotropic semiconductor etch is not required and the risk of amorphization of the trench surfaces where the device channels will form is avoided. Further, the depth of trench 49 may be more carefully controlled since it is primarily determined by thickness 482 of epi-growth mask layer 48 and pillar 48', which provides a convenient etch and/or lap stop in conjunction with any back-lap steps. This is in contrast to merely etching trench 49 where etch depth is usually determined merely by etch time, a much less precise means of control of trench depth. However, trench 49' may also be formed in other ways. For example, structure 41-5 illustrated in FIG. 5 can be formed without epi-growth mask pillar 48', that is, layers 44, 46, 53 merely may be deposited or grown on substrate 42 without involving epi growth mask 48. Then trench 49 is etched into surface 541 of layer 53', thereby yielding structure 41-6 of FIG. 6. From that point on, manufacturing stages 40-7 through 40-9, 40-10 or 40-11 are performed as previously described. As previously noted, such process is prone to undesirable amorphization of the trench sidewalls during RIE. However, if the RIE damaged side-wall material is removed using the relatively gentle isotropic etch step to obtain structure 41-7 depicted in manufacturing stage 40-7, strained semiconductor material 56 can be deposited on a fresh surface unaffected by RIE and the adverse affects of amorphization avoided. With this approach, the substantially isotropic etch step included in manufacturing stage 40-7 should remove not only enough material for corner rounding but also enough material to remove any RIE etch damage, whichever is greater. Either approach is useful.

The manufacturing sequence illustrated by manufacturing stages 40-2 through 40-9, 40-10, or 40-11, show body contact region 63 and source regions 68 being provided after strained semiconductor material 56 is deposited in trench 49. While this is preferred it is not essential. Body contact regions 63 and sources 68 may be formed, for example, by ion implantation (or other doping technique) into structure 41-5 of FIG. 5, followed by the remainder of manufacturing stages 40-6 through 40-9, 40-10 or 40-11, or at other manufacturing stages. Also, while it is convenient to use in-situ doping during growth of layer 53 to provide body region 54, this also is not essential. Layer 53 may be formed of a single conductivity type (e.g., N-type) and then (e.g., P) body region 54 formed by ion implantation or other doping means into, for example, substantially planarized structure 41-5 of stage 40-5. Either arrangement is useful.

Figure 12:
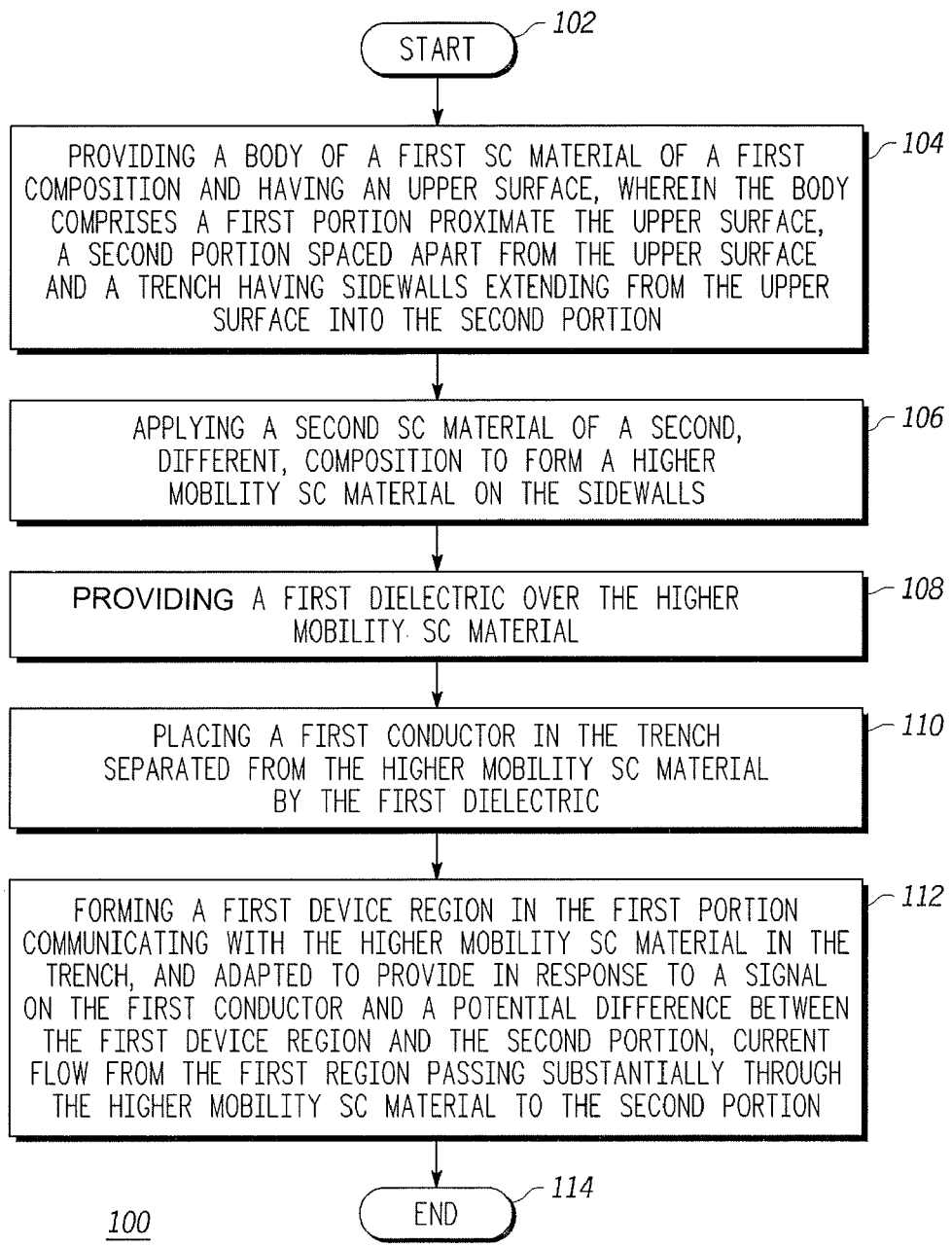
FIGS. 12-13 are simplified flow diagrams illustrating methods for forming the structures illustrated, for example in FIGS. 2-9 and 10-11, according to still further embodiments of the present invention.
Figure 13:
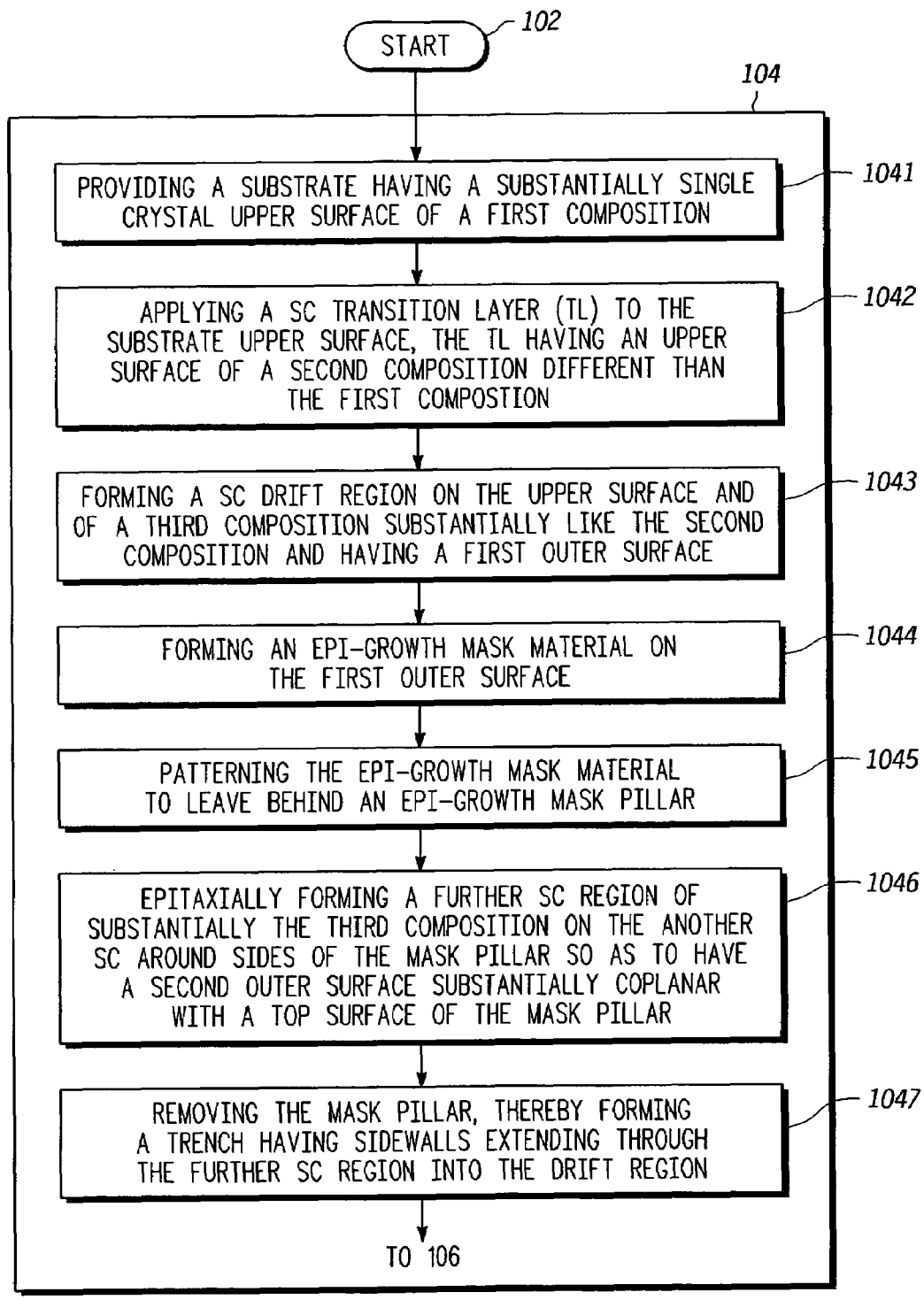

FIGS. 12-13 are simplified flow diagrams illustrating methods for forming the device structures illustrated, for example, in FIGS. 2-9 and FIGS. 10-11, according to still further embodiments of the present invention. Referring now to FIG. 12, method 100 begins with START 102 and initial step 104 wherein a body (e.g., 46, 53') of a first semiconductor (SC) of a first composition is provided, with a first portion (e.g., 54) proximate an upper surface (e.g., 541) of the body and a second portion (e.g., 52, 46) spaced-apart from the upper surface (e.g., 541) and a trench (49, 49') having sidewalls (e.g., 493) extending from the upper surface (e.g., 541) into the second portion (e.g., 52, 46). In subsequent step 106, a second semiconductor (SC) material (e.g., 56) of a second, different, composition is applied to provide a higher mobility semiconductor (SC) material (e.g., 56) at least on the sidewalls (e.g., 493). In subsequent step 108, a first dielectric (e.g., 70) is provided at least over the higher mobility semiconductor (SC) material (e.g., 56). In step 110, a first conductor (e.g., 72) is provided in the trench (e.g., 49, 49') spaced apart from the higher mobility semiconductor (SC) material (e.g., 56) by a portion of the first dielectric (e.g., 70). In step 112, a first device region (e.g., 68) is provided in the first portion (e.g., 54) communicating with the higher mobility semiconductor material (e.g., 56), so that, in response to a signal on the first conductor (e.g., 72) a current (e.g., 87, 87') can flow from the first device region (e.g., 68) through the higher mobility semiconductor (SC) material (e.g., 56) into a drift space part (e.g., 83) of the second portion (e.g., 46). In an exemplary embodiment, the body material is relaxed SiGe and the higher mobility material is a substantially strained silicon. Higher mobility refers to the mobility of the primary current charge carriers, i.e., electrons in an N-channel device and holes in a P-channel device.

Referring now to method 200 illustrated in FIG. 13, wherein sub-steps 1041-1047 of step 104 of method 100 are illustrated according to further embodiments of the present invention and providing further detail. In sub-step 1041, a substrate (e.g., 42) is provided having a substantially single crystal upper surface (e.g., 421) of a first composition (e.g., Si). In sub-step 1042, a semiconductor (SC) buffer or transition layer (TL), e.g., layer 44, is applied to the upper surface (e.g., 421), wherein the transition layer (TL) has an upper surface (e.g., 441) of a second composition (e.g., SiGe) different than the first composition. In sub-step 1043, a semiconductor (SC) drift region (e.g., 46, 83) is formed on the TL upper surface (e.g., 441) of a third composition substantially matching the second composition (e.g., SiGe) and having a first outer surface (e.g., 461). In sub-step 1044, an epi-growth mask layer (e.g., layer 48) is formed on the first outer surface (e.g., 461). In sub-step 1045, the epi-growth mask layer, e.g., layer 48, is patterned to leave behind an epi-growth mask pillar (e.g., 48'). In sub-step 1046, a further semiconductor (SC) region (e.g., 53') of substantially the third composition is epitaxially formed on the another semiconductor (e.g., 46) around sides of the mask pillar (e.g., 48') so as to have an outer surface (e.g., 541) substantially coplanar with a top (e.g., 481) of the mask pillar (48'). In sub-step 1047, the mask pillar (e.g., 48') is removed, thereby forming a trench (e.g., 49, 49') having sidewalls (e.g., 493) extending through the further semiconductor region (e.g., 53') into drift portion 83 of semiconductor region (e.g., 46). Thereafter, method 200 proceeds to step 106 and subsequent steps of method 100.

In a first embodiment, there is provided a method for forming a semiconductor (SC) device, comprising, providing a body of a first semiconductor material of a first composition and having an upper surface, wherein the body comprises a first portion proximate the upper surface, a second portion spaced apart from the upper surface and a trench having sidewalls extending from the upper surface into the second portion, applying a second semiconductor material of a second, different, composition to form a higher mobility semiconductor material at least on the sidewalls, providing a first dielectric at least over the higher mobility semiconductor material, placing a first conductor in the trench separated from the higher mobility semiconductor material by the first dielectric, and forming a first device region in the first portion of the body in the first semiconductor material, communicating with the higher mobility semiconductor material and adapted to provide in response to a signal on the first conductor and a potential difference between the first device region and the second portion, current flow from the first device region passing substantially through the higher mobility semiconductor material to the second portion. According to a further embodiment, the method further comprises as a part of the first providing step, providing a substrate having an upper surface and a substrate composition different than the first composition, forming a transition layer (TL) on the substrate having a first TL composition adjacent the upper surface of the substrate and a second, different TL composition on a further surface separated from the substrate, and forming the first semiconductor material of the first composition on the further surface of the TL. According to a still further embodiment, the first TL composition substantially matches the upper surface of the substrate and the second TL composition substantially matches the first composition. According to a yet further embodiment, the first semiconductor material comprises SiGe and the second semiconductor material is substantially silicon. According to a still yet further embodiment, the substrate is single crystal silicon. According to a yet still further embodiment, the first semiconductor material comprises SiGe in a Si:Ge ratio in the range of about 60:40 to 95:05. According to another embodiment, the second semiconductor material is substantially silicon. According to a yet another embodiment, the device is a TMOS device, and the substrate provides a drain region, the first device region provides a source region, the first conductor provides a gate, and the current flow from the source to the drain passes substantially through the higher mobility semiconductor material on the trench sidewalls.

In a second embodiment, there is provided a semiconductor device, comprising, a substrate comprising a first semiconductor (SC) material having a substrate upper surface of a first composition, a transition layer (TL) of a second semiconductor material having upper and lower surfaces with the TL lower surface on the substrate upper surface, wherein the TL has a second composition at the TL lower surface substantially like the first composition and a third composition different from the second composition at the TL upper surface, a further region of a relaxed third semiconductor material of a fourth composition substantially like the third composition and extending from the TL upper surface to an outer surface, wherein the further region comprises a body region proximate the outer surface and a drift region spaced apart from the outer surface and in communication with the TL, a trench having sidewalls extending from the outer surface through the body region into the drift region, a still further region of a fourth semiconductor material located on the sidewalls of the trench, and of a fifth composition different than the fourth composition so that when in contact with the sidewalls of the trench it is strained relative to the relaxed third semiconductor material, a source located in the body region and communicating with the fourth semiconductor material, a gate dielectric located in the trench over the fourth semiconductor material, and a gate located in the trench in contact with the gate dielectric, adapted when appropriately biased, to induce a conductive channel in the fourth semiconductor material thereby electrically coupling the source to the drift region. According to a further embodiment, the first and fourth semiconductor materials are substantially silicon. According to a yet further embodiment, the relaxed third semiconductor material comprises SiGe. According to a still further embodiment, the relaxed third semiconductor material comprises SiGe having a Si:Ge ratio of about 60:40 to 95:05. According to a yet still further embodiment, the relaxed third semiconductor material comprises SiGe having a Si:Ge ratio of about 70:30 to 90:10. According to a still yet further embodiment, the relaxed third semiconductor material comprises SiGe having a Si:Ge ratio of about 80:20 to 85:15. According to another embodiment, the device further comprises a further dielectric located on a bottom of the trench, having a lower capacitance per unit area than the gate dielectric.

In a third embodiment, there is provided a method for forming a electronic device, comprising, providing a first semiconductor of a first composition having an upper surface, with a body portion proximate the upper surface, a drift portion communicating with the body portion spaced apart from the upper surface and a trench having sidewalls extending from the upper surface into the drift portion, forming a second semiconductor of a second composition adapted to provide a high mobility layer on the trench sidewalls where a part of the body portion is exposed, providing a first dielectric on the higher mobility layer, providing a control gate in the trench, separated from the higher mobility layer by the dielectric, and providing source regions in the body portion proximate the surface and communicating with the higher mobility layer, so that, when biased, source-drain current flows from the source regions through channels induced in the higher mobility layer by the gate and into the drift portion where it can be extracted by a drain or other connection coupled to the drift portion. In a further embodiment, the first providing step comprises, providing a substrate of a first material having a first surface of an initial composition, forming a transition layer on the first surface having a further composition different than the initial composition at a second surface opposite the first surface, and forming the first semiconductor of the first composition on the second surface wherein the first composition substantially matches the further composition. In a still further embodiment, the initial composition is substantially silicon and the further composition is substantially SiGe having a Si:Ge ratio in the range of about 60:40 to 95:05. In a yet further embodiment, the trench has a bottom region in the drift portion and the method further comprises, providing a dielectric of lower capacitance per unit area than the first dielectric on the bottom region separating the gate from the drift portion. In a yet still further embodiment, the second semiconductor does not substantially overlie a bottom portion of the trench.

While at least one exemplary embodiment has been presented in the foregoing detailed description, it should be appreciated that a vast number of variations exist, especially with respect to choices of device types, materials and doping. The above-described invention is especially useful for formation of trench-type TMOS devices, but persons of skill in the art will understand based on the description here in that other types of devices can also be fabricated using the principles described herein. For example, and not intended to be limiting, a trench based vertical IGBT device can be fabricated by using a P+ substrate 42 rather than an N+ substrate 42, with the other device regions as previously described in the various examples. The present invention is also useful for fabrication of Diode, BJT, IGBT and Thyristor devices as well as those described herein. Further, while Si and SiGe are provided as examples of suitable materials for use in combination to produce the adjacent relaxed (lower mobility) and strained (higher mobility) semiconductor regions described herein, this is merely be way of example and not intended to be limiting. The following is a non-limiting list of other suitable semiconductor materials that can be used in combination to achieve analogous lower mobility regions and higher mobility regions in a trench configuration, specifically: GaN and Si, InGaN and GaN, InAsP and InP, SiC and AlN, SiC and BP, SiGe and GaAs, GaAs and Ge, Si and $Si_{1-y}C_y$, and so forth. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming a semiconductor (SC) device, comprising:
    providing a body of a first semiconductor material of a first composition and having an upper surface by
        forming a pillar of an epi-growth mask layer material on an upper surface of a first semiconductor layer,
        providing a first body region on exposed portions of the upper surface of the first semiconductor layer and in contact with sides of the pillar, and
        performing an etching process to selectively etch the pillar, resulting in a creation of a trench having sidewalls extending from the upper surface of the body into the first semiconductor layer;
    applying a second semiconductor material of a second, different, composition to form a higher mobility semiconductor material at least on the sidewalls;
    providing a first dielectric at least over the higher mobility semiconductor material;
    placing a first conductor in the trench separated from the higher mobility semiconductor material by the first dielectric; and
    forming a first device region in the first portion of the body in the first semiconductor material, communicating with the higher mobility semiconductor material and adapted to provide in response to a signal on the first conductor and a potential difference between the first device region and the second portion, current flow from the first device region passing substantially through the higher mobility semiconductor material to the second portion.

2. The method of claim 1, further comprising as a part of the first providing step:
providing a substrate having an upper surface and a substrate composition different than the first composition;
forming a transition layer (TL) on the substrate having a first TL composition adjacent the upper surface of the substrate and a second, different TL composition on a further surface separated from the substrate; and
forming the first semiconductor material of the first composition on the further surface of the TL.

3. The method of claim 2, wherein the first TL composition substantially matches the upper surface of the substrate and the second TL composition substantially matches the first composition.

4. The method of claim 1, wherein the first semiconductor material comprises SiGe and the second semiconductor material is substantially silicon.

5. The method of claim 2, wherein the substrate is single crystal silicon.

6. The method of claim 4, wherein the first semiconductor material comprises SiGe in a Si:Ge ratio in the range of about 60:40 to 95:05.

7. The method of claim 6, wherein the second semiconductor material is substantially silicon.

8. The method of claim 2, wherein the device is a TMOS device; and
the substrate provides a drain region;
the first device region provides a source region;
the first conductor provides a gate; and
the current flow from the source to the drain passes substantially through the higher mobility semiconductor material on the trench sidewalls.

9. A method for forming an electronic device, comprising:
providing a first semiconductor of a first composition having an upper surface, with a body portion proximate the upper surface, and a drift portion communicating with the body portion spaced apart from the upper surface by
forming a pillar of an epi-growth mask layer material on an upper surface of the drift portion,
providing the body portion on exposed portions of the upper surface of the drift portion and in contact with sides of the pillar, and
performing an etching process to selectively etch the pillar, resulting in a creation of a trench having sidewalls extending from the upper surface of the body portion into the drift portion;
forming a second semiconductor of a second composition adapted to provide a high mobility layer at least on the trench sidewalls where a part of the body portion is exposed;
providing a first dielectric on the higher mobility layer;
providing a control gate in the trench, separated from the higher mobility layer by the dielectric; and
providing source regions in the body portion proximate the surface and communicating with the higher mobility layer, so that, when biased, source-drain current flows from the source regions through channels induced in the higher mobility layer by the gate and into the drift portion where it can be extracted by a drain or other connection coupled to the drift portion.

10. The method of claim 9, wherein the first providing step comprises:
providing a substrate of a first material having a first surface of an initial composition;
forming a transition layer on the first surface having a further composition different than the initial composition at a second surface opposite the first surface; and
forming the first semiconductor of the first composition on the second surface wherein the first composition substantially matches the further composition.

11. The method of claim 10, wherein the initial composition is substantially silicon and the further composition is substantially SiGe having a Si:Ge ratio in the range of about 60:40 to 95:05.

12. The method of claim 9, wherein the trench has a bottom region in the drift portion and the method further comprises, providing a dielectric of lower capacitance per unit area than the first dielectric between the gate and the drift portion in the bottom region.

13. The method of claim 9, wherein the second semiconductor does not substantially overlie a bottom portion of the trench.

14. The method of claim 1, wherein forming the pillar comprises:
forming an epi-growth mask layer of the epi-growth mask layer material on the upper surface of the first semiconductor layer; and
etching the epi-growth mask layer to form the pillar.

15. The method of claim 14, wherein etching the epi-growth mask layer comprises performing an anisotropic etch that etches substantially perpendicular to a surface of the epi-growth mask layer.

16. The method of claim 1, wherein providing the body of the first semiconductor material further comprises, after the step of performing the etching process to selectively etch the pillar, etching semiconductor material surrounding the trench to round corners of the trench.

* * * * *

UNITED STATES PATENT AND TRADEMARK OFFICE
CERTIFICATE OF CORRECTION

PATENT NO. : 7,592,230 B2  
APPLICATION NO. : 11/510552  
DATED : September 22, 2009  
INVENTOR(S) : de Frésart et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 377 days.

Signed and Sealed this

Twenty-first Day of September, 2010

David J. Kappos  
*Director of the United States Patent and Trademark Office*